United States Patent
Lin et al.

(10) Patent No.: US 10,663,865 B2
(45) Date of Patent: May 26, 2020

(54) PHOTORESIST RECYCLING APPARATUS

(71) Applicant: Taiwan Semiconductor Manufacturing Co., Ltd., Hsinchu (TW)

(72) Inventors: Chia-Ren Lin, Hsinchu (TW); Penny Hung, Hsinchu (TW); Hung-Chen Lin, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/408,205

(22) Filed: May 9, 2019

(65) Prior Publication Data

US 2020/0004157 A1 Jan. 2, 2020

Related U.S. Application Data

(60) Provisional application No. 62/692,570, filed on Jun. 29, 2018.

(51) Int. Cl.
*G03B 13/00* (2006.01)
*G03F 7/30* (2006.01)

(52) U.S. Cl.
CPC .................. *G03F 7/3092* (2013.01)

(58) Field of Classification Search
USPC .......................................................... 396/565
See application file for complete search history.

(56) References Cited

U.S. PATENT DOCUMENTS

| | | | | |
|---|---|---|---|---|
| 4,778,532 A | * | 10/1988 | McConnell | B05C 3/109 134/10 |
| 5,626,913 A | * | 5/1997 | Tomoeda | G03F 7/162 427/299 |
| 5,900,045 A | * | 5/1999 | Wang | B01D 19/0068 95/241 |
| 6,171,367 B1 | * | 1/2001 | Peng | B01D 19/0031 210/188 |
| 6,299,723 B1 | * | 10/2001 | Seto | B01D 19/0031 134/110 |
| 2004/0076912 A1 | * | 4/2004 | Muraoka | B08B 3/02 430/329 |
| 2004/0081457 A1 | * | 4/2004 | Britcher | G03D 5/00 396/611 |
| 2004/0144736 A1 | * | 7/2004 | Yajima | B01D 19/0068 210/805 |
| 2005/0175472 A1 | * | 8/2005 | Udagawa | B01D 19/0031 417/313 |
| 2005/0224132 A1 | * | 10/2005 | Jang | H01L 21/6715 141/1 |

(Continued)

*Primary Examiner* — Rodney E Fuller
(74) *Attorney, Agent, or Firm* — Sterne, Kessler, Goldstein & Fox P.L.L.C.

(57) ABSTRACT

A method for removing air micro-bubbles from photoresist used to purge a new photoresist filter is disclosed. The method includes flowing photoresist through a photoresist filter to remove air trapped in the photoresist filter, where the trapped air forms air micro-bubbles in the photoresist; collecting, in a buffer tank, the photoresist with air micro-bubbles; removing, in the buffer tank, the air micro-bubbles from the photoresist; and transferring the photoresist without air micro-bubbles from the buffer tank to photolithography equipment.

20 Claims, 6 Drawing Sheets

(56) References Cited

U.S. PATENT DOCUMENTS

| | | | |
|---|---|---|---|
| 2005/0274400 A1* | 12/2005 | Chan | B08B 3/14 |
| | | | 134/94.1 |
| 2006/0029388 A1* | 2/2006 | Terada | H01L 21/6715 |
| | | | 396/611 |
| 2006/0075965 A1* | 4/2006 | Lee | G03F 7/016 |
| | | | 118/683 |
| 2007/0269207 A1* | 11/2007 | Minamida | G03D 3/02 |
| | | | 396/626 |
| 2008/0230492 A1* | 9/2008 | Kao | G03F 7/162 |
| | | | 210/791 |
| 2009/0045140 A1* | 2/2009 | Zahka | B01D 19/0031 |
| | | | 210/718 |
| 2009/0047143 A1* | 2/2009 | Cedrone | F04B 15/02 |
| | | | 417/244 |
| 2014/0303791 A1* | 10/2014 | Batchelder | F04B 49/065 |
| | | | 700/281 |
| 2015/0000517 A1* | 1/2015 | Yoshihara | B01D 19/0031 |
| | | | 95/1 |
| 2015/0092167 A1* | 4/2015 | Terashita | H01L 21/67017 |
| | | | 355/30 |
| 2015/0125793 A1* | 5/2015 | Yoshihara | H01L 21/67017 |
| | | | 430/270.1 |
| 2015/0179483 A1* | 6/2015 | Tseng | H01L 21/6715 |
| | | | 118/300 |
| 2015/0261089 A1* | 9/2015 | Zhou | B67D 7/0294 |
| | | | 137/571 |
| 2017/0107982 A1* | 4/2017 | Cedrone | F04B 13/00 |

* cited by examiner

PHOTORESIST RECYCLING APPARATUS

CROSS-REFERENCE TO RELATED APPLICATION

This application claims the benefit of U.S. Provisional Patent Application No. 62/692,570, titled "Photoresist Recycling Apparatus," which was filed on Jun. 29, 2018 and is incorporated herein by reference in its entirety.

BACKGROUND

The replacement process of a photoresist filter in a photoresist distribution system can include circulating photoresist through the photoresist filter unit to pre-wet the filter and to remove air trapped in the filter. Consequently, the photoresist that circulates through the filter can be infused with air bubbles. Photoresist with air bubbles cannot be used during the photoresist process and as a result, must be discarded. The discarded photoresist adds cost to the semiconductor fabrication process.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
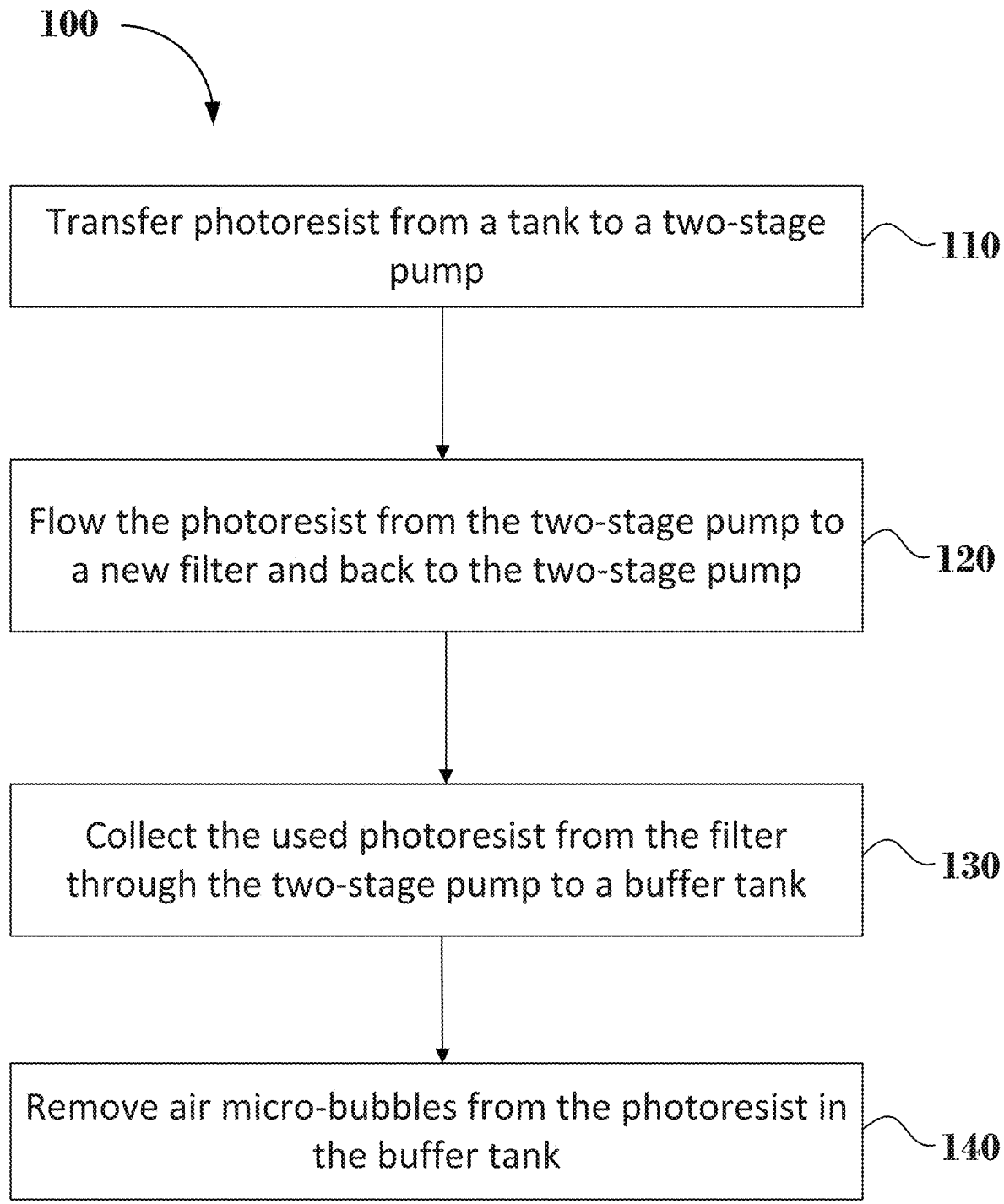
FIG. 1 is a flow chart an exemplary photoresist recycling process after a filter replacement operation, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value).

Chip fabrication in very large scale integration (VLSI) requires a large number of photolithography operations. Each photolithography operation uses a photochemical material, which is referred to as "photoresist." The photoresist is an organic compound that undergoes a change in solubility in the presence of a developer solution due to a prior exposure to an ultraviolet (UV) or extreme ultraviolet (EUV) light. A purpose of the photoresist in chip manufacturing is to transfer a photomask, or reticle, pattern on a top layer of a wafer and to protect underlying material during subsequent processing (e.g., an etching process). The photoresists used in chip manufacturing are dispensed to the wafer surface as a liquid, which can be dried to form a solid film to be patterned. Prior to use, the photoresist can be stored in reservoirs, or tanks, that may be located away from photolithography equipment. A distribution system can be used to transfer the stored photoresist from the reservoirs, or tanks, to the photolithography equipment.

To ensure consistency in the photolithography process, the photoresist quality needs to be substantially the same between photolithography operations. To ensure that the photoresist is free from impurities and particles, the photoresist undergoes a filtering process through, for example, filtering membranes (e.g., photoresist filters) located in various locations within the photoresist distribution system. By way of example and not limitation, photoresist filters can be found close to pumps used to distribute the photoresist to the photolithography equipment. Photoresist filters can have stringent quality requirements. For example, the photoresist filters should not release particles, organic material, metals, and/or other contaminants into the photoresist. Further, the photoresist filters should be able to remove impurities from the photoresist before the photoresist can be dispensed to the photolithography equipment. Photoresist filters can have a pore size in the sub-micron range; for example, the pore size can be less than one micron (e.g., <1 μm).

At the end of its lifetime for example, after about 18 months—the photoresist filter will have to be replaced with a new photoresist filter. Once the old photoresist filter has been replaced, the new photoresist filter will have to be "purged" with photoresist before the photolithography operations can resume. The term "purge" refers to a process where the photoresist passes through the photoresist filter to pre-wet the filter. One critical parameter of the photoresist filter is the "critical wetting surface tension" (CWST) that determines how readily a liquid (e.g., photoresist) can flow through the filter and wet the filter's interior and exterior surfaces. A filter having poor wettability characteristics can impede air displacement (e.g., air removal) from the filter.

Additionally, photoresist filters with poor wettability characteristics may require long purge times to ensure that the photoresist filter has been pre-wet adequately and any trapped air has been removed from the photoresist filter. As a result of the purging process, the photoresist used in the purging process can include trapped air in the form of micro-bubbles (e.g., air micro-bubbles). Because photoresist with air micro-bubbles cannot be used in a photolithography process due to quality control requirements, this photoresist must be discarded (e.g., into a facility drain). For example, photoresist containing air micro-bubbles can lead to patterning defects on the wafers. During the purging process, up to about 2.5 L of photoresist can be consumed and discarded as a result of the air micro-bubbles in the photoresist. As a result, the photoresist filter replacement process can introduce a significant operational cost in the semiconductor fabrication process.

Embodiments of the present disclosure are directed to a photoresist recycling apparatus, system, and method that can remove air micro-bubbles from a photoresist that has been used to purge a photoresist filter. As a result, the photoresist can meet quality control requirements and can be subsequently distributed to photolithography equipment for use during the semiconductor fabrication process. In some embodiments, removal of the air micro-bubbles from the photoresist is accomplished with a photoresist recycling apparatus that includes a "buffer" tank. The buffer tank can store the used photoresist (with the air micro-bubbles). The photoresist in the buffer tank can release the air micro-bubbles in the tank's ambient space, according to some embodiments. The photoresist, after the completion of the air micro-bubble removal process, can be distributed to the photolithography equipment for use during the semiconductor fabrication process. In some embodiments, the apparatus, system, and method disclosed herein recycle the photoresist that would otherwise be discarded. Further, embodiments of the present disclosure can reduce the duration of the filter purging process from about 1 hour to about 10 min, resulting in a significant time savings (e.g., over 80% improvement in purging time) and improved overall throughput in the semiconductor fabrication process.

FIG. 1 is a flow chart of a method 100, which describes an exemplary photoresist recycling process after a filter replacement operation, according to some embodiments of the present disclosure. Embodiments of the present disclosure are not limited to this operational description. Rather, other operations are within the spirit and scope of the present disclosure. It is to be appreciated that additional operations may be performed. Further, some of the operations may be performed simultaneously, or in a different order than shown in FIG. 1. In some embodiments, one or more other operations may be performed in addition to or in place of the presently described operations. For illustrative purposes, method 100 is described with reference to the embodiment of FIG. 2.

Figure 2:
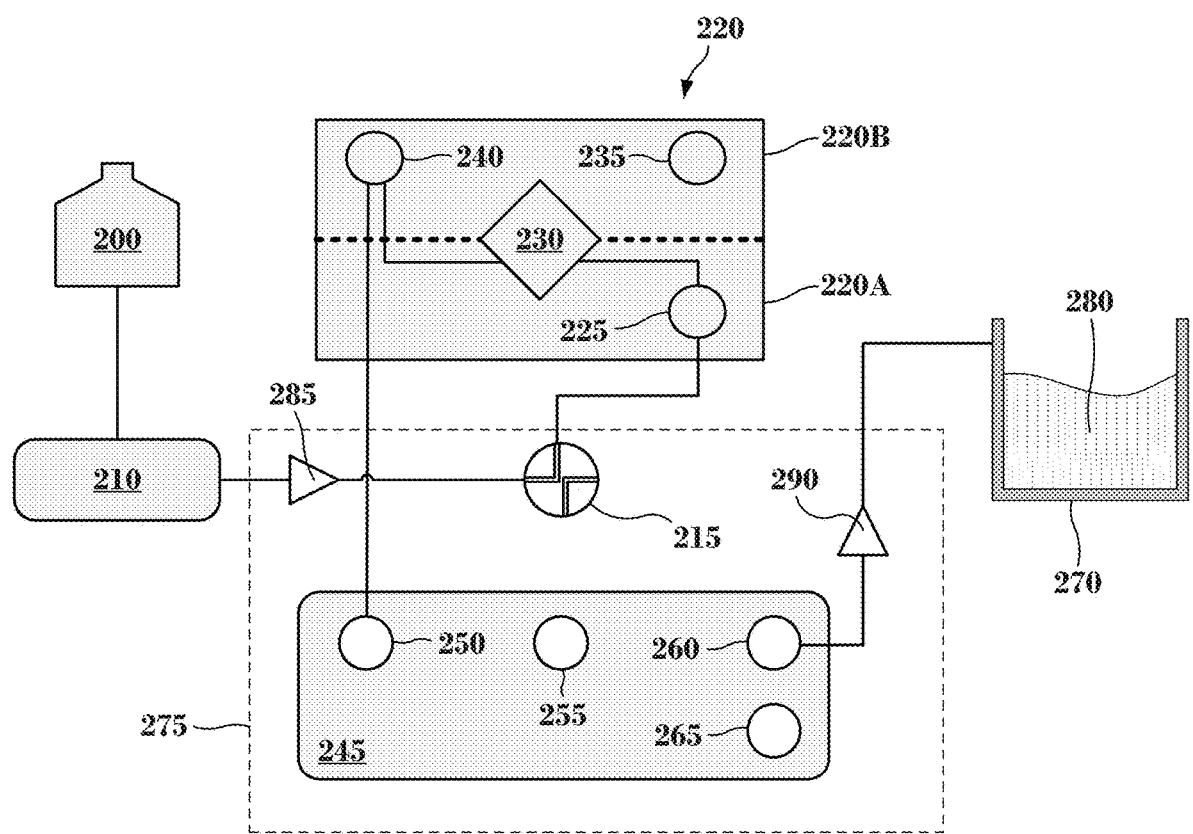
FIG. 2 is an exemplary photoresist distribution system with a photoresist recycling apparatus, according to some embodiments of the present disclosure.

According to some embodiments, FIG. 2 is an exemplary photoresist distribution system. The exemplary photoresist distribution system of FIG. 2 can include, but is not limited to, the following components: a photoresist reservoir 200, a secondary tank 210, a photoresist recycling apparatus 275, a two stage pump 220, a filter 230, and a facility drain 270. In FIG. 2, photoresist delivery lines connect the above-mentioned components of the exemplary distribution system.

Photoresist can be stored in photoresist reservoir 200. A production facility may include several photoresist reservoirs, like photoresist reservoir 200. According to FIG. 2, photoresist reservoir can supply photoresist to a secondary tank 210, which is an intermediate tank that ensures uninterrupted supply of photoresist (e.g., within the photoresist distribution system) when photoresist reservoir 200 undergoes a replacement process. Secondary tank 210 is further fluidly connected to selected components of photoresist recycling apparatus 275. In some embodiments, photoresist recycling apparatus 275 includes an inlet check valve 285, a four-way valve 215, a buffer tank 245, and a drain check valve 290.

Photoresist recycling apparatus 275 can be fluidly connected to a two stage pump 220 and to a facility drain 270. In some embodiments, two-stage pump 220 is a photoresist dispense pump that can dispense photoresist to photoresist equipment (not shown in FIG. 2). The photoresist dispense pump can dispense between about 0.01 ml and about 16 ml of photoresist in about 0.001 ml increments. In some embodiments, two-stage pump 220 can draw photoresist through a feed compartment 220A and dispense it to photolithography equipment through dispense compartment 220B. A photoresist filter 230, which is housed outside of two-stage pump 220, is interposed between the feed compartment 220A and the dispense compartment 220B of two-stage pump 220 so that the photoresist can be filtered as it moves from feed compartment 220A to dispense compartment 220B of two-stage pump 220.

In some embodiments, facility drain 270 can serve as an overfill path for buffer tank 245. For example, in the event that buffer tank 245 overfills with photoresist, the excess quantity of photoresist can be diverted to facility drain 270. Further, facility drain 270 may also include consumed photoresist 280 that has been discarded from the photoresist equipment (not shown in FIG. 2).

In referring to FIGS. 1 and 2, method 100 begins with operation 110, where the photoresist can be transferred from secondary tank 210 to the two-stage pump 220. As discussed above, the photoresist flows within the exemplary photoresist distribution system through the photoresist delivery lines. In operation 110, the photoresist flows initially through inlet check valve 285 to four-way valve 215, where the photoresist is diverted to inlet 225 of feed compartment 220A of two-stage pump 220. In some embodiments, four-way valve 215 is a valve that is configured to divert the flow of the incoming photoresist in three different directions. Hence, four-way valve 215 can divert the photoresist from secondary tank 210 to a different direction (e.g., to different components of the exemplary photoresist distribution system) at different stages of the photoresist dispense process.

In operation 120 of FIG. 1, the photoresist flows from two-stage pump 220 to photoresist filter 230 (e.g. a new photoresist filter) and back to two-stage pump 220 to purge the filter (e.g., pre-wet the filter and remove the air that has been trapped in the filter). More specifically, and referring to FIG. 2, the photoresist flows from feed compartment 220A to dispense compartment 220B through photoresist filter 230 (e.g., a new photoresist filter). In operation 120, photoresist filter 230 is purged. That is, photoresist filter 230 undergoes a pre-wet process and trapped air in photoresist filter 230 is removed. In some embodiments, a photoresist volume of about 2.5 L flows through photoresist filter 230 to remove the trapped air from photoresist filter 230. As the photoresist flows through photoresist filter 230, the trapped air in the filter dissolves/disperses in the photoresist and forms air micro-bubbles. The photoresist that contains the air micro-bubbles cannot be used "as-is" in a photolithography process because the air micro-bubbles can form patterning defects on the wafers. Therefore, the air micro-bubbles in the photoresist will have to be removed before the photoresist can be used in a downstream photolithography process. The photoresist that passes through photoresist filter 230 is channeled back to the dispense compartment 220B of two-stage pump 220 via vent 240. In some embodiments, and during the purge process, two-stage pump 220 operates at pumping speeds similar to a photoresist dispense operation that will be discussed later.

In operation 130, the photoresist with the air micro-bubbles is collected from filter 230 and dispensed into buffer tank 245. As shown in FIG. 2, the photoresist with the air micro-bubbles can be collected from vent 240 of dispense compartment 220B and dispensed into buffer tank 245, via return inlet 250. In some embodiments, buffer tank 245 has a volume that is larger than the volume of the photoresist used to purge photoresist filter 230 according operation 120. In other words, the volume of buffer tank 245 can be about 80 cc. However, this is not limiting and buffer tanks larger or smaller than 80 cc are within the spirit and the scope of this invention.

Figure 3:
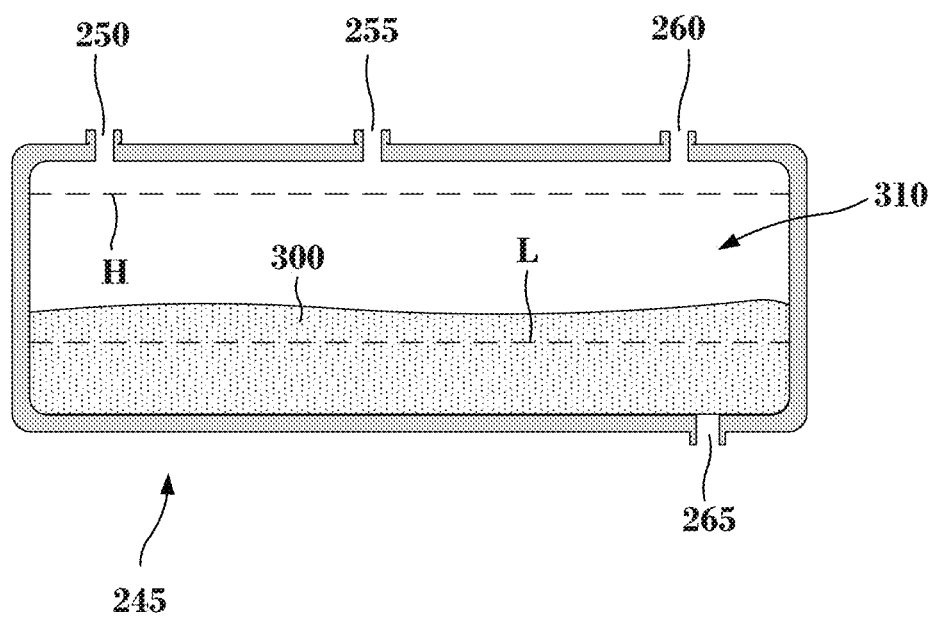
FIG. 3 is a cross-sectional view of a buffer tank, according to some embodiments of the present disclosure.

According to some embodiments, FIG. 3 is a cross-sectional view of buffer tank 245. Buffer tank 245 includes return inlet 250, inlet 255, and outlet 265. In addition to the above mentioned inlets and outlet, buffer tank 245 can be also equipped with photoresist level sensors located, by way of example and not limitation, at positions H and L on the sidewalls of buffer tank 245. In some embodiments, position H is towards the ceiling of buffer tank 245, and position L is towards the bottom of buffer tank 245 and above outlet 265. As such, the photoresist level sensors in buffer tank 245 can be configured to monitor respective high (H) and low levels (L) of photoresist 300 inside buffer tank 245. By way of example and not limitation, a photoresist sensor at position L can be configured to provide a warning when the level of photoresist 300 is low (e.g., below the level of position L; towards outlet 265), and a photoresist sensor at position H can be configured to provide a warning when the level of photoresist 300 is high (e.g., above the level of position H; towards the ceiling of buffer tank 245). In some embodiments, the signals from the photoresist sensors can be used to control the level of photoresist inside buffer tank 245. For example, if the photoresist sensor at position H signals that the level of photoresist is high, the excess amount of photoresist can be diverted to facility drain 270. On the other hand, if the photoresist sensor at position L signals that the level of photoresist is low, flow of photoresist into buffer tank 245 begins.

The positions of return inlet 250, inlet 255, drain 260, and outlet 265 on buffer tank 245 as shown in FIG. 3 are exemplary and are not intended to be limiting. Therefore, alternate positions for return inlet 250, inlet 255, drain 260, and outlet 265 on buffer tank 245 are within the spirit and the scope of this disclosure. Further, positions L and H, as shown in FIG. 3, are also exemplary and not intended to be limiting. For example, the positions L and H on the sidewalls of buffer tank 245 can be closer to one another or further apart from one another, and can depend on the size of buffer tank 245 and the positions of drain 260 and outlet 265. Additionally, the shape of buffer tank is not limited to the illustration of FIG. 3 and other shapes are within the spirit and the scope of this disclosure.

In operation 140 of FIG. 1, the air micro-bubbles are removed from the collected photoresist through a degassing or debubbling process. For example, the air micro-bubble "removal process" can be based on the natural tendency of the air-micro bubbles to move towards the surface of the collected photoresist 300 and escape into the surrounding ambient. In referring to FIG. 3, the air micro-bubbles in photoresist 300 are released through its top surface into the ambient space 310 of buffer tank 245, above photoresist 300. Therefore, photoresist 300, which is drawn from the bottom of buffer tank 245 via outlet 265, is bubble-free. In some embodiments, buffer tank 245 can be coupled to a vacuum pump that facilitates the removal of the air released in buffer tank 245 via the degassing or debubbling process described above. According to some embodiments, during operation 140, the photoresist level inside buffer tank 245 is kept above position L and below position H. By way of example and not limitation, the level of photoresist 300 can be below position H and slightly above position L, as shown in FIG. 3. In some embodiments, a large ambient space 310 over photoresist 300 can prevent a pressure build up during the air release process from photoresist 300. For this reason, buffer tank 245 can be larger than the amount of photoresist 300 used for purging photoresist filter 230, according to operation 120. By way of example and not limitation, buffer tank 245 can be larger than 2.5 L. In some embodiments, the released air from photoresist 300 can escape from buffer tank 245 through drain 260 and drain check valve 290 to facility drain 270, as shown in FIG. 2. According to some embodiments, at the end of (or during) operation 140, photoresist 300 can be distributed through outlet 265 to the photolithography equipment to be used in photolithography operations.

In some embodiments, method 100 can be an automated method that simplifies the filter purging process, reduces cost, and improves productivity. For example, since the photoresist used in the filter purging process can be recycled and subsequently used in a subsequent photolithography operation, larger quantities of photoresist can be used to ensure that the photoresist filter has been sufficiently wetted and the trapped air has been removed. If method 100 is not used, the filter wetting process may involve additional time consuming steps, such as pressurizing secondary tank 210 and reducing the pumping speed of two-stage pump 220 to slowly force the photoresist through photoresist filter 230. In some embodiments, method 100 can reduce the duration of the filter purging process from about 1 hour to about 10 min, resulting in significant time savings (e.g., over 80% improvement in purging time) and improved overall throughput in the semiconductor fabrication process.

According to some embodiments, the use of photoresist recycling apparatus 275 is not limited to method 100. For example, after the completion of operation 140 of method 100, the photoresist in buffer tank 245, which is free from air micro-bubbles, can be used in a photoresist dispense operation, where photoresist is distributed to photolithography equipment. By way of example and not limitation, FIG. 4 is an exemplary connection diagram of photoresist recycling apparatus 275 as part of a photoresist distribution system that distributes photoresist to photolithography equipment.

Figure 4:
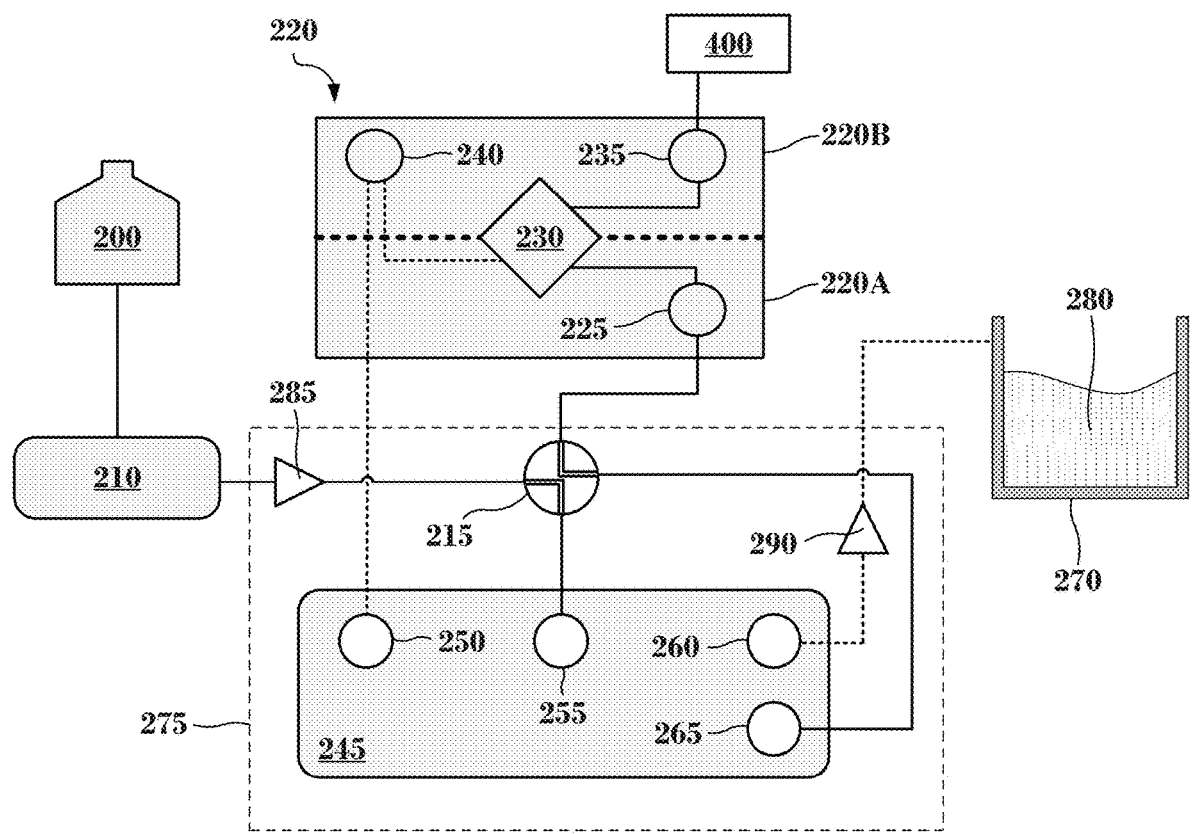
FIG. 4 is an exemplary photoresist distribution system with a photoresist recycling apparatus, according to some embodiments of the present disclosure.
Figure 5:
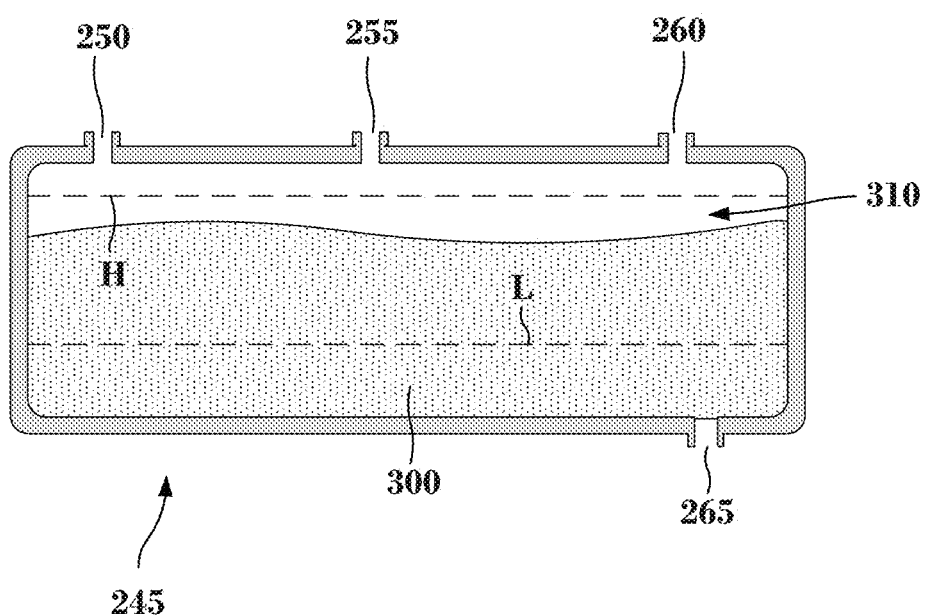
FIG. 5 is a cross-sectional view of a buffer tank, according to some embodiments of the present disclosure.

In referring to FIG. 4, and according to some embodiments, the photoresist flows from secondary tank 210 to photoresist recycling apparatus 275. For example, the photoresist flows from secondary tank 210 via inlet check valve 285 to four-way valve 215, where the photoresist is diverted to inlet 255 of buffer tank 245 to fill buffer tank 245 as shown in FIG. 5. As discussed above, photoresist 300 in buffer tank 245 is free from air micro-bubbles and, therefore, the photoresist from secondary tank 210 is allowed to flow into buffer tank 245. In referring to FIG. 4, the photoresist can subsequently flow from outlet 265 of buffer tank 245 back to four-way valve 215. Four-way valve 215 diverts the flow of the photoresist to inlet 225 of feed compartment 220A of two-stage pump 220. From there, the photoresist passes through photoresist filter 230, which is now pre-wetted and contains no air, and flows towards outlet 235 of dispense compartment 220B of two-stage pump 220. From outlet 235, the photoresist is distributed to photolithography equipment 400.

For illustration purposes, FIG. 4 includes selected portions of the photoresist distribution system and other portions (not shown) may also be included. The portions of the photoresist distribution system of FIG. 4 that are not shown can include, but are not limited to, additional photoresist delivery lines, additional valves, level sensors, air bubble sensors, electronic equipment, controllers, additional pumping systems, and the like. For example, the delivery line, which connects outlet 265 of buffer tank 245 to four-way valve 215, can be equipped with an air bubble sensor, which is not shown in FIG. 4 for simplicity. The air bubble sensor can be configured to detect the presence of air micro-bubbles in the photoresist that passes through the delivery line during the photoresist dispense operation. Consequently, the photoresist dispense operation can be interrupted in the event that air micro-bubbles are detected in the photoresist leaving buffer tank 245.

FIG. 5 is a cross-sectional view of buffer tank 245 during the photoresist dispense operation to photolithography equipment 400 described above. By way of example and not limitation, during the photoresist dispense operation, buffer tank 245 can be filled with photoresist 300. For example, the level of photoresist 300 in buffer tank 245 can be between position H and position L, but closer to position H, as shown in FIG. 5. In the event that the level of photoresist 300 drops below position L, the corresponding sensor at position L will be triggered and additional photoresist can flow from secondary tank 210 into buffer tank 245, as discussed above. Similarly, in the event that the level of photoresist 300 rises above position H, the corresponding sensor at position H will be triggered and the excess quantity of photoresist 300 can be diverted to facility drain 270 (shown in FIG. 4) through drain check valve 290 to prevent overfilling buffer tank 245.

Figure 6:
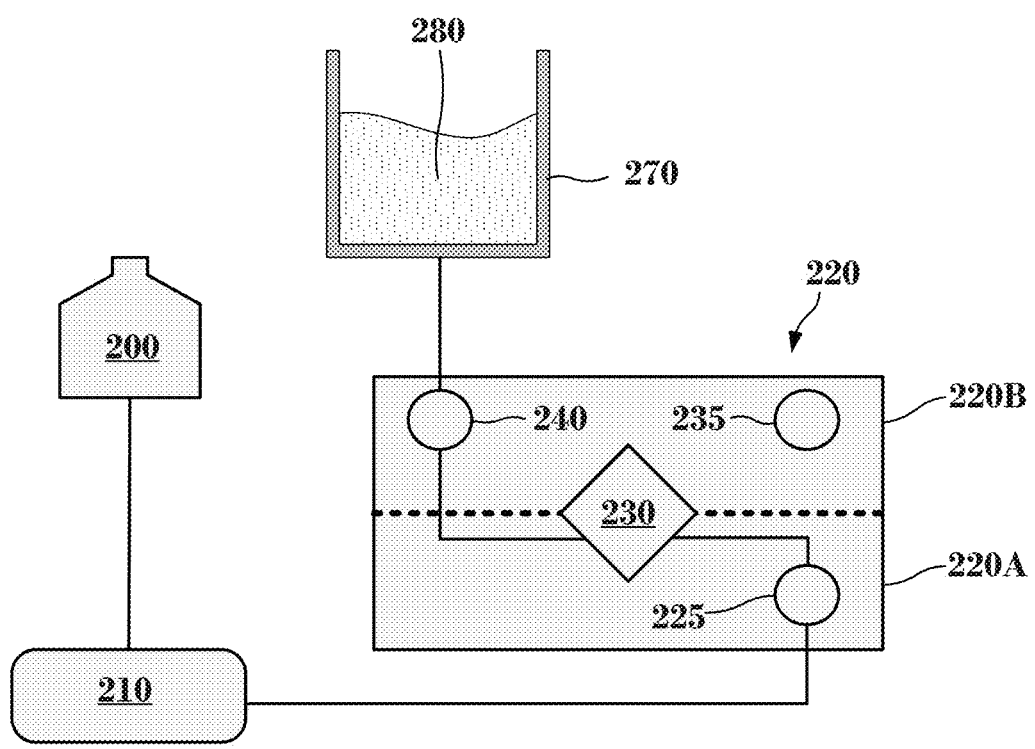
FIG. 6 is an exemplary photoresist distribution system without a photoresist recycling apparatus, according to some embodiments of the present disclosure.

The exemplary photoresist distribution system in FIGS. 2 and 4 provide advantages over other photoresist distribution systems, such as the photoresist distribution system shown in FIG. 6. These advantages include, but are not limited to, photoresist cost savings and system efficiency. The photoresist distribution system of FIG. 6 includes photoresist reservoir 200, secondary tank 210, two stage pump 220 with photoresist filter 230 (e.g., a new photoresist filter), and facility drain 270. In contrast to the photoresist distribution systems described in FIGS. 2 and 4, the photoresist distribution system in FIG. 6 does not include a photoresist recycling apparatus, such as photoresist recycling apparatus 275. Therefore, the photoresist distribution system of FIG. 6—unlike the photoresist distribution systems shown in FIGS. 2 and 4—cannot recycle the photoresist that has been used in a new filter replacement process.

By way of example and not limitation, the operation of the photoresist distribution system in FIG. 6, during a new photoresist filter purging process, can be explained as follows. Secondary tank 210 is filled with photoresist from reservoir 200. Secondary tank 210, as discussed above, is an intermediate tank that ensures uninterrupted photoresist supply (e.g., within the photoresist distribution system) when, for example, photoresist reservoir 200 is being filled. The photoresist can flow through photoresist delivery lines from secondary tank 210 to inlet 225 of two-stage pump 220. In some instances, secondary reservoir 200 is pressurized with nitrogen to force the photoresist through two-stage pump 220. This procedure can be time consuming since two-stage pump 220 is not operated under the photoresist dispense operation and its pumping speed is reduced. As discussed above, two-stage pump 220 is a photoresist dispense pump that can dispense between about 0.01 ml and about 16 ml of photoresist in about 0.001 ml increments to photoresist equipment (not shown in FIG. 2). In some embodiments, two-stage pump 220 can draw photoresist through feed compartment 220A and dispense it to photolithography equipment through dispense compartment 220B. Photoresist filter 230, which is housed outside two-stage pump 220, is interposed between the two compartments of two-stage pump 220 so that the photoresist can be filtered or can purge photoresist filter 230 as it moves from feed compartment 220A to dispense compartment 220B.

Subsequently, the photoresist purges the replaced photoresist filter 230 by passing through photoresist filter 230 between the two compartments (e.g., 220A and 220B) of two-stage pump 220. As a result of the purging process, the photoresist may contain trapped air in the form of air micro-bubbles. Since photoresist with air micro-bubbles cannot be used by downstream photolithography equipment, the photoresist has to be discarded in facility drain 270. By way of example and not limitation, facility drain 270 contains discarded photoresist 280 from photolithography equipment and/or other sources (not shown in FIG. 6). For example, the photoresist used to purge photoresist filter 230 is discarded to facility drain 270 through vent 240 of two-stage pump 220. During the above mentioned purging process of new photoresist filter 230, the quantity of the photoresist that is used can amount to about 2.5 L. Such quantity of photoresist use can adversely impact photolithography cost, since the photoresist filter may need to be replaced every 18 months or an even shorter period and a semiconductor fabrication facility can have multiple photoresist filters to replace.

Embodiments of the present disclosure are directed to a photoresist recycling apparatus and method that can be used to remove air micro-bubbles from photoresist used to purge a new photoresist filter (e.g., in a two-stage pump). The recycled photoresist can be subsequently distributed to photolithography equipment. In some embodiments, the method used herein can simplify the filter purging process, and reduce the photolithography cost by saving the photoresist that has been used in a new filter purging process. In some embodiments, since the photoresist used in the filter purging process can be recycled and subsequently used in a downstream photolithography operation, larger quantities of photoresist (e.g., larger than 2.5 L) can be used to ensure that the photoresist filter has been sufficiently conditioned and all the trapped air has been removed. According to some embodiments, the photoresist recycling apparatus and method described herein can reduce the duration of the filter purging process from about 1 hour to about 10 min, which is an improvement of over 80% in purging time.

In some embodiments, a photoresist distribution system includes a photoresist reservoir tank; a photoresist filter; and a pump that is configured to pump a photoresist through the photoresist filter and to distribute the filtered photoresist to photolithography equipment. The photoresist distribution system also includes a photoresist recycling apparatus, which includes a buffer tank; a first photoresist passage between an outlet of the pump and the buffer tank; and a second photoresist passage between an outlet of the buffer tank and an inlet of the pump.

In some embodiments, a method includes flowing photoresist through a photoresist filter to remove air trapped in the photoresist filter, where the trapped air forms air micro-bubbles in the photoresist; collecting, in a buffer tank, the photoresist with air micro-bubbles; removing, in the buffer tank, the air micro-bubbles from the photoresist; and transferring the photoresist without air micro-bubbles from the buffer tank to photolithography equipment.

In some embodiments, a system includes a photoresist reservoir tank that is configured to store photoresist; a pump that is configured to distribute the photoresist to photolithography equipment and which includes a teed compartment and a dispense compartment. The system further includes a photoresist filter that is fluidly connected to the feed and the dispense compartments of the pump; and a photoresist recycling apparatus that is configured to receive photoresist used to purge the photoresist filter. Further, the photoresist recycling apparatus includes a buffer tank, which is configured to remove trapped air in the received photoresist; one or more photoresist sensors; and a photoresist outlet at a bottom surface of the buffer tank. Additionally, the photoresist recycling apparatus includes a four-way valve that is fluidly connected to the buffer tank and the pump.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventors), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A photoresist distribution system, comprising:
   a photoresist reservoir tank;
   a photoresist pump comprising a receiving compartment and a distribution compartment, wherein the receiving compartment is configured to receive photoresist from the photoresist reservoir tank;
   a photoresist filter fluidly connected between the receiving and distribution compartments of the photoresist pump; and
   a photoresist recycling apparatus comprising a buffer tank fluidly connected to the distribution compartment of the photoresist pump and configured to receive the photoresist from the distribution compartment.

2. The photoresist distribution system of claim 1, further comprising a four-way valve configured to divert the photoresist from the photoresist reservoir tank to the buffer tank and from the buffer tank to the receiving compartment of the pump.

3. The photoresist distribution system of claim 2; wherein the four-way valve is fluidly connected to the photoresist reservoir, the buffer tank, and the receiving compartment of the pump.

4. The photoresist distribution system of claim 2, wherein the buffer tank is fluidly connected to the receiving compartment of the pump through the four-way valve.

5. The photoresist distribution system of claim 1; further comprising a drain fluidly connected to the buffer tank.

6. The photoresist distribution system of claim 1, wherein the photoresist filter is housed outside the pump.

7. The photoresist distribution system of claim 1, wherein the buffer tank comprises sensors configured to monitor a level of the photoresist inside the buffer tank.

8. The photoresist distribution system of claim 1, wherein the buffer tank is configured to remove air micro-bubbles dissolved in the filtered photoresist.

9. A method, comprising:
   flowing photoresist from a photoresist reservoir tank to a first compartment of a pump;
   pumping, through a photoresist filter, the photoresist from the first compartment of the pump to a second compartment of the pump to remove air trapped in the photoresist filter, wherein the trapped air forms air micro-bubbles in the photoresist;
   collecting the photoresist with air micro-bubbles in a buffer tank;
   degassing the air micro-bubbles from the photoresist to an area of the buffer tank above the photoresist; and
   after degassing the air micro-bubbles from the photoresist, transferring the photoresist from the buffer tank to photolithography equipment.

10. The method of claim 9, wherein degassing the air micro-bubbles comprises allowing micro-bubbles in the photoresist to escape from a top surface of the photoresist.

11. The method of claim 9, wherein transferring the photoresist comprises:
    transferring the photoresist from the buffer tank to the first compartment of the pump;
    pumping the photoresist through the photoresist filter from the first compartment of the pump to the second compartment of the pump; and
    dispensing the photoresist from the second compartment of the pump to the photolithography equipment.

12. The method of claim 9, wherein transferring the photoresist further comprises flowing the photoresist through a micro-bubble sensor between the buffer tank and the first compartment of the pump.

13. A system, comprising:
    a photoresist reservoir tank configured to store photoresist;
    a pump comprising a feed compartment and a dispense compartment, wherein the pump is configured to distribute the photoresist to photolithography equipment;
    a photoresist filter disposed between and fluidly connected to the teed and the dispense compartments of the pump; and
    a photoresist recycling apparatus configured to receive photoresist used to purge the photoresist filter, wherein the photoresist recycling apparatus comprises:
       a buffer tank configured to remove trapped air in the received photoresist and comprising one or more photoresist sensors and a photoresist outlet at a bottom surface of the buffer tank; and
       a four-way valve fluidly connecting the buffer tank, the pump, and the photoresist reservoir tank.

14. The system of claim 13, wherein the photoresist is transferred to the pump and distributed to the photolithography equipment from the photoresist outlet at the bottom surface of the buffer tank.

15. The system of claim 13, wherein the photoresist recycling apparatus further comprises a vacuum pump coupled to the buffer tank and configured to remove the trapped air in the received photoresist from the buffer tank.

16. The system of claim 13, wherein the one or more photoresist sensors are configured to determine a level of the photoresist in the buffer tank.

17. The system of claim 13, wherein a first sensor of the one or more photoresist sensors is positioned on a top portion of the buffer tank and a second sensor of the one or more photoresist sensors is positioned on a bottom portion of the buffer tank.

18. The system of claim 17, wherein the first sensor is configured to detect a level of the photoresist for a top half portion of the buffer tank.

19. The system of claim 17, wherein the second sensor is configured to detect a level of the photoresist for a bottom half portion of the buffer tank.

20. The system of claim 13, wherein the buffer tank has a capacity of about 80 cc.

* * * * *